United States Patent
Zhuang et al.

(10) Patent No.: US 6,764,537 B2
(45) Date of Patent: Jul. 20, 2004

(54) COPPER METAL PRECURSOR

(75) Inventors: Wei-Wei Zhuang, Vancouver, WA (US); Lawrence J. Charneski, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/453,829

(22) Filed: Jun. 2, 2003

(65) Prior Publication Data

US 2003/0203111 A1 Oct. 30, 2003

Related U.S. Application Data

(62) Division of application No. 09/820,227, filed on Mar. 27, 2001, now Pat. No. 6,596,344.

(51) Int. Cl.⁷ .............................. C23C 16/18; C07F 1/08
(52) U.S. Cl. ................. 106/1.26; 106/287.18; 427/250; 427/252; 556/12; 556/41; 556/117
(58) Field of Search .................. 106/1.26, 287.18; 427/250, 252; 556/12, 41, 117

(56) References Cited

U.S. PATENT DOCUMENTS

| | | | | |
|---|---|---|---|---|
| 4,425,281 A | * | 1/1984 | Doyle | 556/41 |
| 5,144,049 A | * | 9/1992 | Norman et al. | 556/12 |
| 6,090,964 A | * | 7/2000 | Rhee et al. | 556/117 |
| 6,102,993 A | * | 8/2000 | Bhandari et al. | 106/1.18 |
| 6,130,345 A | * | 10/2000 | Doppelt | 556/12 |
| 6,245,261 B1 | * | 6/2001 | Zhuang et al. | 252/519.2 |
| 6,281,377 B1 | * | 8/2001 | Zhuang et al. | 556/112 |
| 6,534,666 B1 | * | 3/2003 | Zorich et al. | 556/41 |
| 6,642,401 B2 | * | 11/2003 | Watanabe et al. | 556/12 |

* cited by examiner

Primary Examiner—Porfirio Nazario-Gonzalez
(74) Attorney, Agent, or Firm—David C. Ripma; Matthew D. Rabdau

(57) ABSTRACT

A method for chemical vapor deposition of copper metal thin film on a substrate includes heating a substrate onto which the copper metal thin film is to be deposited in a chemical vapor deposition chamber; vaporizing a precursor containing the copper metal, wherein the precursor is a compound of ($\alpha$-methylstyrene)Cu(I)(hfac), where hfac is hexafluoroacetylacetonate, and (hfac)Cu(I)L, where L is an alkene; introducing the vaporized precursor into the chemical vapor deposition chamber adjacent the heated substrate; and condensing the vaporized precursor onto the substrate thereby depositing copper metal onto the substrate. A copper metal precursor for use in the chemical vapor deposition of a copper metal thin film is a compound of ($\alpha$-methylstyrene)Cu(I)(hfac), where hfac is hexafluoroacetylacetonate, and (hfac)Cu(I)L, where L is an alkene taken from the group of alkenes consisting of 1-pentene, 1-hexene and trimethylvinylsilane.

3 Claims, No Drawings

COPPER METAL PRECURSOR

CROSS REFERENCE TO RELATED APPLICATIONS

This application is a divisional of application Ser. No. 09/820,227, filed Mar. 27, 2001, entitled "Method of Depositing a High-Adhesive Copper Thin Film on a Metal Nitride Substrate," invented by Zhuang et al. now U.S. Pat. No. 6,596,344.

FIELD OF THE INVENTION

This invention relates to formation of copper thin films, and specifically to the formation of a copper thin film on a nitride-based substrate using a volatile precursor and CVD.

BACKGROUND OF THE INVENTION

Because of the low electrical resistivity, ~1.7 $\mu\Omega$-cm, and high resistance to electromigration, the use of CVD to form copper thin films has gained much attention. Copper thin film is considered to be ideal for use as metal interconnection material in IC devices.

The techniques for CVD of copper thin films requires the use of a stable and volatile precursor, preferably in liquid form. From a commercial standpoint, the precursor cost must be reasonable. The resulting thin film must have good adhesive properties to metal-nitride coated substrates, low resistivity, i.e. <1.8 $\mu\Omega$-cm, excellent conformity to surface structures and irregularities, and good electromigration resistance. In CVD processing, the copper precursor must have not only a high enough vapor pressure to maintain a reasonable deposition rate, it must also be stable at the deposition temperature without any decomposition in the CVD liquid delivery line or vaporizer.

Copper metal thin films may be prepared via CVD by using any of a number of copper precursors, such as $Cu(C_5H_5)(PR_3)$, where R=methyl, ethyl, or butyl, as disclosed by Beach et al., in Chem. Mater., Vol. 2, pp. 216–219 (1990). Hampden-Smith et al. achieved similar results using (tert-BuO)Cu(PMe$_3$), Chem. Mater., Vol. 2, p 636 (1990). The previously described thin films, however, contain sufficient contaminants of carbon and phosphorous to preclude use of the resulting thin film as interconnectors in microprocessors.

The studies of copper precursors in the early 1990's concentrated on the evaluation of a series of copper(I) fluorinated β-diketonate complexes, have subsequently been proven to be acceptable sources for use in CVD of copper metal thin films. Copper(I) fluorinated β-diketonate complexes were first synthesized by Doyle, U.S. Pat. No. 4,385,005, for Process for separating unsaturated hydrocarbons using copper or silver complexes with fluorinated diketonates, granted May 24, 1983, and U.S. Pat. No. 4,425,281, for Copper or silver complexes with fluorinated diketones and unsaturated ligands, granted Jan. 10, 1984, which describe the synthesis method and application in the separation of unsaturated organic hydrocarbons. Doyle et al., Organometallics, Vol. 4, p. 830 (1985)

U.S. Pat. No. 5,096,737 to Baum et al., for Ligand stabilized +1 metal β-diketonate coordination complexes and their use in chemical vapor deposition of metal thin films, granted Mar. 17, 1992, describes the use of copper(I) fluorinated β-diketonate complexes as copper precursors for CVD copper thin film preparation. Subsequent work described the use of Cu(hfac)(CH$_3$C≡CCH$_3$), where hfac= hexafluoroacetylacetonate, as disclosed by Baum et al., Chem Mater, Vol. 4, p. 365 (1992), and Baum et al., J. Electrochem. Soc., 1993, Vol. 140, No. 1., 154–158 (1993). Copper thin films have been prepared via CVD using these precursors.

Other potential precursors, including 1,5-dimethyl 1,5-cyclooctadiene copper(I) hexafluoroacetylacetonate mixed with 1,6-dimethyl 1,5-cyclooctadiene copper(I) hexafluoroacetylacetonate ((DMCOD)Cu(hfac) and hexyne copper(I) hexafluoroacetylacetonate ((HYN)Cu(hfac)) have been extensively evaluated. The copper thin films deposited using (DMCOD)Cu(hfac) demonstrate good adhesive properties to metal and metal nitride substrates, however, they have a resistivity on the order of 2.5 $\mu\Omega$-cm and also have a low deposition rate. (HYN)Cu(hfac) suffers from poor adhesion to a TiN substrate, and has a resistivity on the order of 2.1 $\mu\Omega$-cm, which is unacceptable.

Another compound, butyne copper(I)(hfac), ((BUY)Cu (hfac), provides a copper thin film having a low resistivity of about 1.93 $\mu\Omega$-cm, however, the thin film demonstrates poor adhesive properties, the precursor is relatively expensive and is a solid at room temperature.

The provision of Cu(hfac)(TMVS) precursor, where TMVS=trimethylvinylsilane, as disclosed by Norman et al., Journal de Physique IV, Vol. 1., C2-271–278, September 1991, and U.S. Pat. No. 5,085,731 for Volatile liquid precursors for the chemical vapor deposition of copper, granted Feb. 4, 1992, resulted in copper thin films having improved properties. Copper thin films deposited using liquid Cu(hfac)(TMVS) have low resistivites and are reasonably adhesive to substrates. This particular precursor has been used for copper thin film formation by CVD for some time, however, the precursor still exhibits some drawbacks, such as a lack of stability, less than desirable adhesion, and excessive cost, as the TMVS stabilizer is an expensive compound. The foregoing have reported the deposition of pure copper thin films in laboratory processes.

SUMMARY OF THE INVENTION

A method for chemical vapor deposition of copper metal thin film on a substrate includes heating a substrate onto which the copper metal thin film is to be deposited in a chemical vapor deposition chamber; vaporizing a precursor containing the copper metal, wherein the precursor is a compound of (α-methylstyrene)Cu(I)(hfac), where hfac is hexafluoroacetylacetonate, and (hfac)Cu(I)L, where L is an alkene; introducing the vaporized precursor into the chemical vapor deposition chamber adjacent the heated substrate; and condensing the vaporized precursor onto the substrate thereby depositing copper metal onto the substrate.

A copper metal precursor for use in the chemical vapor deposition of a copper metal thin film is a compound of (α-methylstyrene)Cu(I)(hfac), where hfac is hexafluoroacetylacetonate, and (hfac)Cu(I)L, where L is an alkene taken from the group of alkenes consisting of 1-pentene, 1-hexene and trimethylvinylsilane.

It is an object of the invention to provide a copper thin film CVD precursor which is stable, liquid at ambient temperatures, and is relatively inexpensive.

Another object of the invention is to provide a copper thin film CVD precursor which results in a copper thin film having good adhesive properties to underlying substrates, particularly those having nitride components.

A further object of the invention is to provide a copper thin film CVD precursor which results in a copper thin film having desirable electrical properties.

This summary and objectives of the invention are provided to enable quick comprehension of the nature of the

DETAILED DESCRIPTION OF THE PREFERRED EMBODIMENT

The precursor used in the method of the invention is formed by the mixture of (α-methylstyrene)Cu(I)(hfac), where hfac is hexafluoroacetylacetonate, and (hfac)Cu(I)L, where L is an alkene, such as 1-pentene, 1-hexene, and trimethylvinylsilane. The addition of (α-methylstyrene)Cu(I)(hfac) to the other, very volatile copper precursors produces a copper thin film having very high adhesive properties to metal nitride substrates. The mixture may be applied in a cleaned CVD vaporizer, showerhead and reactor, following a two to three wafer chamber conditioning.

One example of the precursor of the invention is a mixture of 10% (w/w) (α-methylstyrene)Cu(I)(hfac) and 90% (w/w) (hfac)Cu(I)TMVS. Another example of the precursor of the invention is a mixture of 10% (w/w) (α-methylstyrene)Cu(I)(hfac) and 90% (w/w) (hfac)Cu(I)1-pentene.

Conditions in the CVD chamber are a vaporizer temperature of 65° C., a showerhead temperature of 65° C., a deposition temperature of 190° C., deposition chamber pressure of 0.5 Torr, a helium carrier gas flow rate of 100 sccm, a wet helium bubbling gas flow rate of 2.5 sccm and distance between the showerhead and the wafer of 20 mm.

Copper thin films formed by the foregoing method, using the precursors of the invention, exhibit high adhesive properties, particularly to metal nitride substrates, such as titanium nitride and tantalum nitride, and a resistivity on the order of 1.9 $\mu\Omega$-cm. The precursor materials are stable, and are relatively inexpensive. The precursors are suitable for commercial fabrication of both copper seed layers and CVD of copper thin film layers for metallization and interconnect in ICs.

Thus, a method and a chemical precursor for depositing a high-adhesive copper thin film on a metal nitride substrate has been disclosed. It will be appreciated that further variations and modifications thereof may be made within the scope of the invention as defined in the appended claims.

We claim:

1. A copper metal precursor for use in the chemical vapor deposition of a copper metal thin film, comprising:
a compound of (α-methylstyrene)Cu(I)(hfac), where hfac is hexafluoroacetylacetonate, and (hfac)Cu(I)L, where L is an alkene taken from the group of alkenes consisting of 1-pentene, 1-hexene and trimethylvinylsilane.

2. The copper metal precursor of claim 1 wherein said compound is in a ratio of about 10% by weight (α-methylstyrene)Cu(I)(hfac), and about 90% by weight (hfac)Cu(I)L.

3. The copper metal precursor of claim 1 which is deposited on a substrate in a chemical vapor deposition chamber wherein chamber conditions are vaporizer temperature is about 65° C., the showerhead temperature is about 65° C., the ambient deposition temperature is about 190° C., the pressure in the chamber is about 0.5 Torr, the helium carrier gas flow rate is about 100 sccm, the wet helium bubbling gas flow rate is about 2.5 sccm and distance between the showerhead and the wafer is about 20 mm.

* * * * *